United States Patent
Lin et al.

[11] Patent Number: 6,026,028
[45] Date of Patent: Feb. 15, 2000

[54] HOT CARRIER INJECTION PROGRAMMING AND NEGATIVE GATE VOLTAGE CHANNEL ERASE FLASH EEPROM STRUCTURE

[75] Inventors: Chen-Hsi Lin; Chih-Ming Chen; Ling-Sung Wang, all of Hsinchu; Horng-Ming Lee, Chang-Hwa; Ko-Hsing Chang, Hsinchu, all of Taiwan

[73] Assignee: Worldwide Semiconductor Manufacturing Corp., Hsinchu, Taiwan

[21] Appl. No.: 09/123,305

[22] Filed: Jul. 28, 1998

[30] Foreign Application Priority Data

Jan. 12, 1998 [TW] Taiwan ................................. 87200414

[51] Int. Cl.⁷ .................................................... G11C 13/00
[52] U.S. Cl. ................................. 365/185.33; 365/185.29

[58] Field of Search ........................... 365/185.01, 185.1, 365/185.11, 185.14, 185.26, 185.29, 185.33

[56] References Cited

U.S. PATENT DOCUMENTS 5,963,479  10/1999  Park et al. ......................... 365/185.33

*Primary Examiner*—Terrell W. Fears
*Attorney, Agent, or Firm*—Thomas, Kayden, Horstemeyer & Risley

[57] ABSTRACT

A flash electrical erasable programmable read only memory structure that utilizes hot carrier injection for programming and negative gate voltage to carry out channel erase operations. Characteristic of the memory structure includes a triple well structure having a P-well and an N-well located within a P-type substrate, wherein the N-well isolated the P-well from the P-type substrate. Therefore, an independently isolated triple well structure is established during memory erase operation.

11 Claims, 2 Drawing Sheets

HOT CARRIER INJECTION PROGRAMMING AND NEGATIVE GATE VOLTAGE CHANNEL ERASE FLASH EEPROM STRUCTURE

CROSS-REFERENCE TO RELATED APPLICATION

This application claims the priority benefit of Taiwan application serial No. 87200414, filed Jan. 12, 1998, the full disclosure of which is incorporated herein by reference.

BACKGROUND OF THE INVENTION

1. Field of Invention

The present invention relates to a type of electrically erasable programmable read only memory (EEPROM). More particularly, the present invention relates to a flash EEPROM that utilizes hot carrier injection to conduct programming operations and negative gate voltage to conduct channel erase operations.

2. Description of Related Art

Conventional flash EEPROM that carries out memory erase operations with a high voltage applied to the source terminal has a number of drawbacks. For example, the flash EEPROM originally designed by Intel has the following drawbacks. First, the high voltage at the source junction during memory erase operation will establish band-to-band tunneling conduction, which will lead to the generation of a rather high memory erase current flowing from the source terminal to the substrate. The generation of such a high current through an on-chip charge pumping circuit is very difficult, therefore an extra high voltage source of about 12V needs to be supplied from outside. Secondly, besides establishing band-to-band tunneling conduction at the source terminal junction, a high voltage at the source terminal junction also generates hot holes. These hot holes can easily be trapped inside an oxide layer causing the so-called "gate disturbance", thereby lowering the charge retention capability of a memory cell. Thirdly, to provide a high voltage at the source junction, a double diffused graded junction structure is required. The double diffused graded junction structure occupies substantial substrate area making the reduction of dimensions for the next generation of memory device rather difficult.

Another type of conventional flash EEPROM can be found in the design suggested by AND in U.S. Pat. No. 5,077,691. In the design, a higher negative gate voltage and a relatively low positive voltage are applied to the source terminal junction of a memory cell. Although this design can resolve most of the problems related to the conventional Intel flash memory, the mechanism of memory erase is still carried out at the source terminal (known as source-terminal erase). A device that employs the source-terminal erase mechanism generally has a non-uniform erasing property, and hence the reliability for these types of devices is normally rather low.

In light of the foregoing, there is a need to provide an improved flash EEPROM structure.

SUMMARY OF THE INVENTION

Accordingly, the present invention is to provide a flash EEPROM architecture that utilizes hot carrier injection for programming and negative gate voltage for carrying out channel erase operations. The flash EEPROM structure of this invention is capable of eliminating the drawbacks of the two aforementioned conventional flash EEPROM designs.

To achieve these and other advantages and in accordance with the purpose of the invention, as embodied and broadly described herein, the invention provides a flash EEPROM structure that utilizes hot carrier injection for programming and negative gate voltage for channel erase operations. The characteristic of this memory structure is the construction of a triple well structure so that an independently isolated well is formed when memory erase operation is carried out. The memory structure comprises the triple well structure, a pair of source/drain regions, a floating gate and a control gate.

According to one preferred embodiment of this invention, the triple well structure includes a P-well, an N-well and a P-type substrate (P-sub). Furthermore, the P-well and the N-well are located within the P-sub with the N-well isolating the P-well from the P-sub. Therefore, during memory erase operation, P-well/N-well can be independently bias rather than having to apply a positive voltage to the source terminal as in a conventional flash memory.

The triple well structure can be formed using processes similar to those used in the fabrication of a conventional CMOS. In General, there are two methods for forming the triple well structure. The first method is to form a shallow P-base well in the original N-well, and the second method is to form a deeper N-well first before forming the P-well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
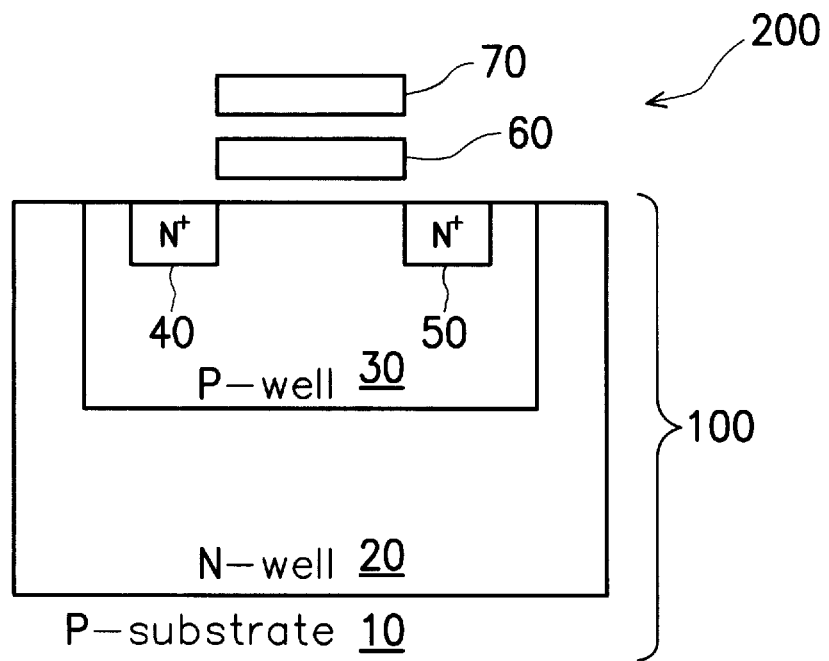
FIG. 1 is a cross-sectional view showing the structure of a flash EEPROM cell according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional view showing the structure of a flash EEPROM cell according to one preferred embodiment of this invention. As shown in FIG. 1, the characteristic of this flash EEPROM structure 200 of the invention is a triple well structure 100 that forms an isolated well during memory erase operation. The triple well structure 100 includes a P-well 30, an N-well 20 and a P-type substrate (P-sub) 10. The P-well 30 and the N-well 20 are located inside the P-sub 10 and the N-well 20 isolates the P-well 30 from the P-sub 10. The memory structure 200 includes the triple well structure 100, a pair of source/drain regions 40 and 50, a floating gate 60 and a control gate 70. The pair of source/drain regions 40 and 50 is located inside the P-well 30 of the triple well structure 100. The floating gate 60 is located above the triple well structure 100 and lies between the source/drain regions 40 and 50. The control gate 70 is located above the floating gate 60.

Because a triple well structure is employed in this invention, a higher positive channel voltage together with a matching negative gate voltage can be used to achieve a memory erase operation. There is no need for the provision of an additional high voltage source from outside as required by most conventional flash memory designs.

Furthermore, to obtain better properties for the triple well structure 100, the P-well 30 can be a shallow P-base well and the N-well 20 can be a deep N-well. The triple well structure 100 can be formed using similar processes as in the fabrication of a conventional CMOS. In fact, there are two methods for forming the triple well structure. The first method is to form a shallow P-well in the original N-well, and the second method is to form a deeper N-well outside the P-well. For example, a deep N-well is first formed in a P-type substrate, and then a P-well is formed inside the deep N-well; or, an N-well is first formed in the P-type substrate, and then a shallow P-base well is formed inside the deep N-well.

Table 1 below shows an example of bias voltages applied to various constituent parts of the memory cell during programming, erasing and reading operations according to this invention.

TABLE 1

|  | Control Gate 70 | Drain 40 | Source 50 | P-/N-well 30/20 |
| --- | --- | --- | --- | --- |
| Program | 9V | 5V | 0V | 0V |
| Erase | −9V | Floating | Floating | 9V |
| Read | 3.3V | 1.2V | 0V | 0V |

Figure 2:
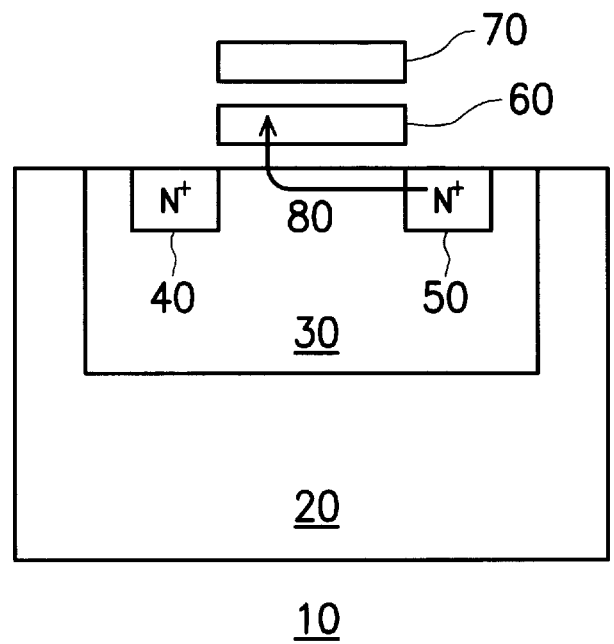
FIG. 2 is a cross-sectional view showing a flash EEPROM cell in a programming operation according to one preferred embodiment of this invention.

FIG. 2 is a cross-sectional view showing a flash EEPROM cell in a programming operation according to one preferred embodiment of this invention. In a programming operation, the control gate 70 is set to about 9V, the drain terminal 40 is set to about 5V and the source terminal 50 is set to 0V. Furthermore, the P-well/N-well 30/20 are both set to 0V. Hence, hot carriers are able to inject into the floating gate following the direction as shown by an arrow 80.

Figure 3:
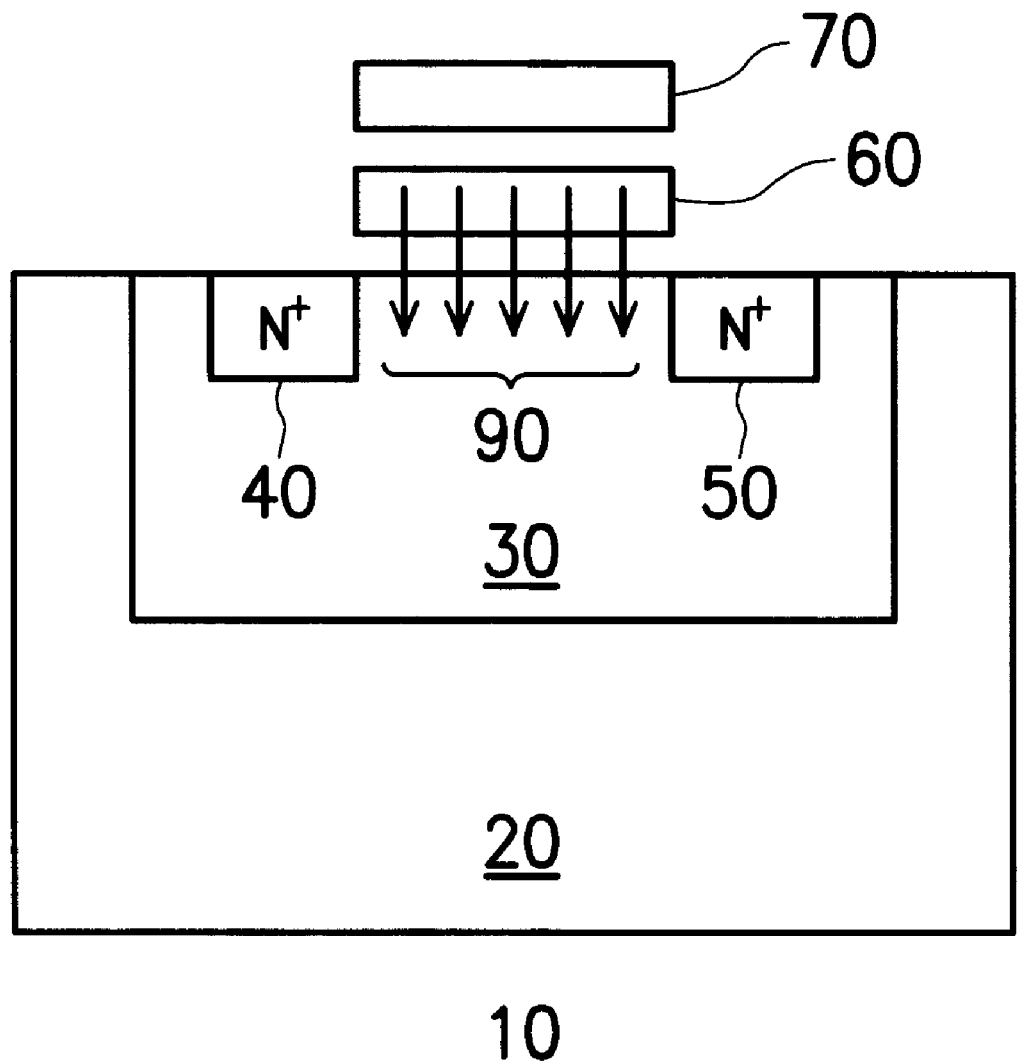
FIG. 3 is a cross-sectional view showing a flash EEPROM cell in a channel erase operation according to one preferred embodiment of this invention.

FIG. 3 is a cross-sectional view showing a flash EEPROM cell in a channel erase operation according to one preferred embodiment of this invention. In a channel erase operation, the control gate 70 is set to about −9V, the drain terminal 40 is set to a floating state and the source terminal 50 is also set to a floating state. Then, the P-well/N-well 30/20 are both set to 9V. Hence, charges will flow from floating gate 60 in the direction as indicated by an arrow 90 according to the Fowler-Nordheim (FN) tunneling effect. Since a high voltage is not applied to the source terminal 50 as in most conventionally designed flash memories, the source terminal 50 can be a single diffused junction.

The main characteristic in the design of this flash EEPROM 200 is the triple well structure 100. During memory erase, the triple well structure 100 forms an independently isolated well. Hence, a higher positive channel voltage together with a matching negative gate voltage can be used for a uniform erase operation. The purpose of having a triple well structure 100 is to allow the application of a high voltage to individual P-well 30 rather than having to apply a high voltage to every P-well. This is because the N-well 20 isolates the P-well 30 from the P-sub 10. In other words, the embodiment of this invention provides a flash EEPROM structure capable of hot carrier injection programming and negative gate voltage channel erasing operations. The read operation of this invention is similar to a conventional flash EEPROM, so detailed description is omitted here.

Furthermore, the above description of operation refers to an N-channel flash memory. However, the principles behind the working of a P-channel flash memory are the same. The structural changes that are necessary for a P-channel flash memory is to form a triple well structure having an N-well 30, a P-well 20 and an N-sub 10 instead.

As a summary, the advantages of using the flash EEPROM of this invention include:

(1) Compared with a conventional negative gate terminal/source terminal memory erase method, the channel erase operation provided by the memory structure of this invention is more uniform, and so the reliability of the memory is increased.

(2) The negative voltage applied to the gate terminal and the positive voltage applied to the channel can be tuned to any value as long as their sum in voltage after taking their absolute values remain low. Hence, there is no need for an additional high voltage source from outside.

(3) Since the memory of this invention does not employ a source terminal erase mechanism, hot holes due to a band-to-band tunneling current disappear. Without hot holes, gate disturbance due to trapped hot holes inside an oxide layer can be avoided.

(4) Unlike a conventional EEPROM that uses a source terminal erase mechanism for memory erase, a high voltage at the source terminal is unnecessary for this invention. Hence, a single diffused junction rather than a double diffused graded junction can be used. A single diffused junction is always preferred because it can produce memory with smaller cell dimensions.

(5) At present, two modes of operation for flash memory exist. One mode uses hot carrier injection for programming and source terminal erasing mechanism for memory erase. In a second mode, FN tunneling is used for carrying out both programming and erasing operations. The memory architecture of this invention provide a third mode of operation that utilizes hot carrier injection for carrying out programming and a negative gate voltage for carrying out channel erase operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash electrical erasable programmable read only memory structure that utilizes hot carrier injection for programming and negative gate voltage for channel erasing, comprising:

a P-type substrate;

an N-well located inside the P-type substrate;

a P-well located inside the N-well such that the N-well isolates the P-well from the P-type substrate;

a pair of source/drain regions located inside the P-well;

a floating gate located above the P-well lying between the pair of source/drain regions; and a control gate located above the floating gate;

wherein a first positive voltage is applied to the N-well/P-well, a first negative voltage is applied to the control gate and the pair of source/drain regions are at floating state which induces a Fowler-Nordheim tunneling effect between the floating gate and the P-well to erase the flash electrical erasable programmable read only memory.

2. The structure of claim 1, wherein the N-well includes a deep N-well.

3. The structure of claim 1, wherein the P-well further includes a shallow P-base well.

4. The structure of claim 1, wherein the source region has a single diffused junction.

5. The structure of claim 1, wherein the first positive voltage is about 9V and the first negative voltage is about −9V.

6. A flash electrical erasable programmable read only memory structure that utilizes hot carrier injection for programming and negative gate voltage for channel erasing, comprising:

a triple well structure including a P-well, an N-well and a P-type substrate, wherein the P-well and the N-well is located inside the P-type substrate, the N-well isolates the P-well from the P-type substrate, and the triple well structure forms an independently isolated well during memory erase operation;

a pair of source/drain regions located inside the P-well of the triple well structure;

a floating gate located above the triple well structure and between the pair of source/drain regions; and a control gate located above the floating gate.

7. The structure of claim 6, wherein the N-well includes a deep N-well.

8. The structure of claim 6, wherein the P-well further includes a shallow P-base well.

9. The structure of claim 6, wherein the source region has a single diffused junction.

10. The structure of claim 7, wherein the triple well structure is formed by first forming the deep N-well in the P-type substrate and then forming the P-well inside the deep N-well.

11. The structure of claim 8, wherein the triple well structure is formed by first forming the deep N-well in the P-type substrate and then forming the shallow P-base well inside the deep N-well.

* * * * *